United States Patent
Jia et al.

(10) Patent No.: US 9,653,878 B2
(45) Date of Patent: May 16, 2017

(54) CIRCUIT, OPTICAL MODULE, METHODS AND OPTICAL COMMUNICATION SYSTEM FOR DUAL RATE POWER POINT COMPENSATION

(71) Applicant: SOURCE PHOTONICS (CHENGDU) CO., LTD., Chengdu, Sichuan (CN)

(72) Inventors: Chaobo Jia, Chengdu (CN); Yuanjun Huang, Chengdu (CN); Yuanzhong Xu, Chengdu (CN)

(73) Assignee: Source Photonics (Chengdu) Co., Ltd., Chengdu (CN)

( * ) Notice: Subject to any disclaimer, the term of this patent is extended or adjusted under 35 U.S.C. 154(b) by 161 days.

(21) Appl. No.: 14/412,611

(22) PCT Filed: Dec. 23, 2014

(86) PCT No.: PCT/CN2014/094604
§ 371 (c)(1),
(2) Date: Jan. 2, 2015

(87) PCT Pub. No.: WO2016/101125
PCT Pub. Date: Jun. 30, 2016

(65) Prior Publication Data
US 2016/0226217 A1 Aug. 4, 2016

(51) Int. Cl.
*H01S 3/00* (2006.01)
*H01S 3/13* (2006.01)
(Continued)

(52) U.S. Cl.
CPC .............. *H01S 3/1305* (2013.01); *H01S 3/09* (2013.01); *H01S 5/0683* (2013.01); *H04B 10/07* (2013.01);
(Continued)

(58) Field of Classification Search
CPC ....................................................... H01S 5/042
(Continued)

(56) References Cited

U.S. PATENT DOCUMENTS

| 5,579,328 A | 11/1996 | Habel et al. |
| 7,653,102 B2 * | 1/2010 | Miller .................. H01S 5/0683 372/29.011 |

(Continued)

FOREIGN PATENT DOCUMENTS

| CN | 102340350 A | 2/2012 |
| CN | 102447219 A | 5/2012 |
| JP | S6276333 A | 4/1987 |

OTHER PUBLICATIONS

PCT International Search Report and Written Opinion; PCT International Searching Authority/CN dated Aug. 26, 2015; International Application No. PCT/CN2014/094604; 9 pages; International Searching Authority/State Intellectual Property Office of the P.R. China; Beijing, China.

(Continued)

*Primary Examiner* — Ken N Vanderpuye
*Assistant Examiner* — Amritbir Sandhu
(74) *Attorney, Agent, or Firm* — Andrew D. Fortney; Central California IP Group, P.C.

(57) ABSTRACT

A dual-rate power point compensating circuit, comprising a microprocessor and a transmitter optical subsystem assembly (TOSA), wherein the TOSA includes a laser connected to a laser driver, a monitor photodiode (MPD) connected to the laser driver, and a current divider connected to the microprocessor and the MPD. When a feedback current from the MPD exceeds the adjustable and/or operating range of the laser driver, the feedback current is reduced so that it is kept in the adjustable and/or operating range of the laser driver. The laser driver determines the optical output power of the laser from the value of the reduced feedback current.

(Continued)

The circuit and method extend the adjustable and/or operating range of a laser driver and enable it to regulate a target optical output power of the laser with a broad testing range and high accuracy when the feedback current is relatively high.

20 Claims, 6 Drawing Sheets

(51) Int. Cl.
  *H04B 10/07* (2013.01)
  *H01S 3/09* (2006.01)
  *H04B 10/079* (2013.01)
  *H04B 10/40* (2013.01)
  *H04B 10/50* (2013.01)
  *H01S 5/0683* (2006.01)
  *H01S 5/042* (2006.01)

(52) U.S. Cl.
  CPC ....... *H04B 10/07955* (2013.01); *H04B 10/40* (2013.01); *H04B 10/503* (2013.01); *H01S 5/042* (2013.01)

(58) Field of Classification Search
  USPC .......................................... 372/29.015, 38.02
  See application file for complete search history.

(56) References Cited

U.S. PATENT DOCUMENTS

| | | | |
|---|---|---|---|
| 7,916,765 | B2 | 3/2011 | Irie |
| 8,178,826 | B2* | 5/2012 | Ikegami ................. G09G 3/02 250/205 |
| 8,670,473 | B2 | 3/2014 | Azadeh et al. |
| 8,903,254 | B2* | 12/2014 | Hu ........................ H04B 10/40 372/38.02 |
| 2002/0014849 | A1* | 2/2002 | Tsujikawa ............. H01S 5/0683 315/169.1 |
| 2002/0164960 | A1* | 11/2002 | Slaughter ............... G01V 8/005 455/73 |
| 2003/0007525 | A1* | 1/2003 | Chen .................... H01S 5/0683 372/31 |
| 2003/0174744 | A1* | 9/2003 | Reilly .................. H01S 5/0683 372/32 |
| 2004/0081213 | A1* | 4/2004 | Schrodinger .......... H01S 5/042 372/38.02 |
| 2004/0114649 | A1* | 6/2004 | Asuri .................. H01S 5/06832 372/38.02 |
| 2005/0117615 | A1* | 6/2005 | Fujiie .................... G11B 7/126 372/38.04 |
| 2005/0135444 | A1* | 6/2005 | Krishnaswami ........ H01S 5/042 372/38.02 |
| 2006/0164712 | A1* | 7/2006 | Ishibashi ............... H01S 5/0683 359/239 |
| 2007/0030868 | A1* | 2/2007 | Sekigawa ............. H01S 5/0683 372/29.015 |
| 2009/0041071 | A1* | 2/2009 | Irie ....................... H01S 5/0683 372/29.015 |
| 2009/0238226 | A1* | 9/2009 | Moto ..................... H01S 5/042 372/38.02 |
| 2009/0323744 | A1* | 12/2009 | Tachigori .............. H01S 5/0683 372/38.02 |
| 2010/0111123 | A1* | 5/2010 | Fujimura ................ H01S 5/042 372/38.07 |
| 2011/0038641 | A1* | 2/2011 | Tanaka ................. H04B 10/564 398/197 |
| 2013/0148680 | A1 | 6/2013 | Azadeh et al. |
| 2013/0293661 | A1* | 11/2013 | Takezawa ................ B41J 2/471 347/224 |
| 2015/0110143 | A1* | 4/2015 | Van Lochem ........ H01S 5/0428 372/38.03 |
| 2015/0372776 | A1* | 12/2015 | He ........................ H04L 5/1469 398/28 |

OTHER PUBLICATIONS

Mohammed Azad et al.; "Optical Power Control Circuit"; Abstract of CN102447219 (A); May 9, 2012; 1 pg.; http://worldwide.espacenet.com.

Jiang Xu et al.; "DDMI (digital diagnostic monitoring interface) Optical Module Transmitter Circuit and Optical Power Monitoring Method for Same"; Abstract of CN102340350 (A); Feb. 1, 2012; 1 pg.; http://worldwide.espacenet.com.

Yoshihiko Nishimura et al.; "Automatic Controller for Optical Output"; Abstract of JPS6276333 (A); Apr. 8, 1987; 2 pgs.; http://worldwide.espacenet.com.

* cited by examiner

CIRCUIT, OPTICAL MODULE, METHODS AND OPTICAL COMMUNICATION SYSTEM FOR DUAL RATE POWER POINT COMPENSATION

FIELD OF THE INVENTION

The present invention relates to the field of modules for optical or optoelectronic networks, especially to circuits, modules, methods and systems for adjusting or compensating a driving current in a dual-rate optical transmitter. More specifically, embodiments of the present invention pertain to circuits, modules and methods for dual-rate power point (e.g., target optical output power) compensation in optical or optoelectronic communication networks.

DISCUSSION OF THE BACKGROUND

In the field of optical or optoelectronic modules, many such modules operate at two rates (e.g., so-called "dual-rate" modules). A laser in the transmitter portion of the module (a transmitter optical subassembly, or TOSA) may output data at each rate in a different mode of operation (e.g., a low-rate mode and a high-rate mode). The different modes may have a large operational or output power range from the high rate to the low rate, and the dynamic range of the current in a monitoring photodiode on a back facet of the transmitter laser is accordingly large.

A laser driver may drive the laser in the TOSA using the monitoring photodiode in closed-loop regulation, and the laser may have a target optical output power. However, the adjustable range of conventional laser drivers cannot cover all current distribution ranges of typical back facet monitoring photodiodes. Therefore, when the current from the monitoring photodiode exceeds the adjustable range of the laser driver, the laser driver cannot regulate the laser output power. As a result, a mechanism that can extend the adjustable range of laser drivers to regulate the target output power of a laser in the TOSA of an optical or optoelectronic module when the current from a monitoring photodiode a relatively high is desired.

This "Discussion of the Background" section is provided for background information only. The statements in this "Discussion of the Background" are not an admission that the subject matter disclosed in this "Discussion of the Background" section constitutes prior art to the present disclosure, and no part of this "Discussion of the Background" section may be used as an admission that any part of this application, including this "Discussion of the Background" section, constitutes prior art to the present disclosure.

SUMMARY OF THE INVENTION

The present invention is intended to overcome one or more deficiencies in the prior art, and provide a circuit, optical module, compensation method and optical communication system for dual-rate power point (or target output power) compensation using the adjustable and/or operating range of a laser driver to enable it to regulate the target optical output power of a laser in a TOSA having a relatively high feedback current.

In one respect, the present invention provides a circuit configured to compensate a dual-rate power point of a laser, comprising a microprocessor and a TOSA, the TOSA comprising the laser, a laser driver connected to the laser, and a monitoring photodiode (MPD) connected to the laser driver. The MPD is configured to provide a current (e.g., a feedback current) representative of or corresponding to the output power of the laser in real time. The MPD may also be positioned on a back facet of the TOSA to receive a portion of the light from the laser. The laser driver provides a driving current to the laser based on the value of the feedback current from the MPD, and is thus configured to determine the optical output power of the laser. The circuit further comprises a current divider connecting the microprocessor with the MPD. When the laser operates in high output power mode, and the feedback current may exceed an adjustable range of the laser driver (e.g., the laser driver may be unable to regulate the output power of the laser), the microprocessor instructs the current divider to reduce the feedback current (which may be a DC current) by a predetermined amount to keep the feedback current in the adjustable and/or operating range of the laser driver. The laser driver can then determine the output power of the laser from the reduced feedback current.

In one embodiment, when the laser operates in a low output power mode, and the feedback current from the MPD is in the adjustable and/or operating range of the laser driver, the microprocessor disables the current divider, and the laser driver determines the output power of the laser from the feedback current. The current divider may comprise a bypass resistor coupled between the MPD and the microprocessor (e.g., an I/O port of the microprocessor). In a further embodiment, the laser driver may comprise a driver chip.

In a second aspect, the present invention provides a method of compensating, regulating or adjusting an output power of a laser in an optical or optoelectronic module, comprising obtaining a current (e.g., a feedback current, which may be a DC current) from a photodiode in a TOSA of the optical or optoelectronic module; and reducing the feedback current by a predetermined amount when the laser operates in a high output power mode, the predetermined amount keeping the reduced feedback current in an adjustable and/or operating range of a laser driver providing a driving current to the laser. In general, the laser driver determines the optical output power of the laser based on the feedback current in a low-power mode and on the reduced feedback current in the high-power mode. In the high-power mode, the feedback current from the MPD may exceed the adjustable and/or operating range of the laser driver, and the laser driver may be unable to regulate the output power of the laser. In various embodiments, a current divider reduces the feedback current by the predetermined amount, and a microprocessor electrically connected to the laser driver and/or the current divider instructs the current divider to reduce the feedback current when the laser or optical/optoelectronic module enters the high-power mode.

In a further embodiment, the method further comprises disabling the current divider when the laser operates in the low output power mode, and the feedback current from the MPD is in the adjustable and/or operating range of the laser driver. In such a case, the method may further comprise determining the output power of the laser from the feedback current (e.g., directly from the feedback current). The microprocessor may disable the current divider when the laser operates in the low output power mode. In addition, the laser driver may provide a driving current directly from the feedback current when the laser operates in the low output power mode.

In a third aspect, the present invention provides an optical module comprising the above-mentioned circuit configured to compensate the dual-rate power point(s) of a laser. In various examples, the optical module further comprises a receiver optical subassembly (ROSA) and a limiting amplifier coupled in proper order (e.g., where the limiting amplifier receives an electrical signal from the ROSA corresponding to an optical signal received by the ROSA from an optical or optoelectronic network).

In a fourth aspect, the present invention provides an optical communication system, including one or more optical communication devices and at least one optical module as mentioned above, the at least one optical module being configured to connect the optical communication devices. In various embodiments, the optical communication devices may be fiber switches, optical network units (ONUs), optical line terminals/terminations (OLTs), and/or passive optical networks (PONs).

The present invention has the following beneficial effects. In the present invention, when feedback current from an optical module exceeds the adjustable and/or operating range of a laser driver, and the laser driver fails to regulate the optical output power of the TOSA, a microprocessor in the optical module enables a current divider to capture or reduce a predetermined amount of DC current from the feedback current (e.g., the DC current from the MPD), thereby keeping the feedback current in the adjustable and/or operating range of the laser driver. Then, the laser driver determines the optical output power of the laser from the DC current from the MPD. Thus, when the feedback current from the MPD (e.g., in real time) exceeds the adjustable and/or operating range of the laser driver, the laser driver can regulate the target output power of the laser from a relatively high feedback current. This solution extends the adjustable range of laser drivers and enables regulation of target laser output power from a relatively high feedback current with a broad range and high accuracy.

DETAILED DESCRIPTION

Reference will now be made in detail to various embodiments of the invention, examples of which are illustrated in the accompanying drawings. While the invention will be described in conjunction with the following embodiments, it will be understood that the descriptions are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it will be readily apparent to one skilled in the art that the present invention may be practiced without these specific details. In other instances, well-known methods, procedures, components, and circuits have not been described in detail so as not to unnecessarily obscure aspects of the disclosure.

Some portions of the detailed descriptions which follow are presented in terms of processes, procedures, logic blocks, functional blocks, processing, and other symbolic representations of operations on code, data bits, or data streams within a computer, transceiver, processor, controller and/or memory. These descriptions and representations are generally used by those skilled in the data processing arts to effectively convey the substance of their work to others skilled in the art. A process, procedure, logic block, function, process, etc., is herein, and is generally, considered to be a self-consistent sequence of steps or instructions leading to a desired and/or expected result. The steps generally include physical manipulations of physical quantities. Usually, though not necessarily, these quantities take the form of electrical, magnetic, optical, or quantum signals capable of being stored, transferred, combined, compared, and otherwise manipulated in a computer, data processing system, or circuit. It has proven convenient at times, principally for reasons of common usage, to refer to these signals as bits, streams, values, elements, symbols, characters, terms, numbers, or the like, and to their representations in computer programs or software as code (which may be object code, source code or binary code). It should be borne in mind, however, that all of these and similar terms are associated with the appropriate physical quantities and/or signals, and are merely convenient labels applied to these quantities and/or signals.

Unless specifically stated otherwise, or as will be apparent from the following discussions, it is appreciated that throughout the present application, discussions utilizing terms such as "processing," "operating," "calculating," "determining," or the like, refer to the action and processes of a computer, data processing system, or similar processing device (e.g., an electrical, optical, or quantum computing or processing device or circuit) that manipulates and transforms data represented as physical (e.g., electronic) quantities. The terms refer to actions and processes of the processing devices that manipulate or transform physical quantities within the component(s) of a circuit, system or architecture (e.g., registers, memories, other such information storage, transmission or display devices, etc.) into other data or information similarly represented as physical quantities within other components of the same or a different system or architecture.

Furthermore, in the context of this application, the terms "signal" and "optical signal" refer to any known structure, construction, arrangement, technique, method and/or process for physically transferring a signal or optical signal, respectively, from one point to another. Also, unless indicated otherwise from the context of its use herein, the terms "fixed," "given," "certain" and "predetermined" generally refer to a value, quantity, parameter, constraint, condition, state, process, procedure, method, practice, or combination thereof that is, in theory, variable, but is typically set in advance and not varied thereafter when in use. Similarly, for convenience and simplicity, the terms "time," "rate," "period" and "frequency" are, in general, interchangeable and may be used interchangeably herein, as are the terms "data," "bits," and "information," but these terms are generally given their art-recognized meanings.

For the sake of convenience and simplicity, the terms "optical" and "optoelectronic" are generally used interchangeably herein, and use of either of these terms also includes the other, unless the context clearly indicates otherwise, but these terms are generally given their art-recognized meanings herein. Furthermore, the term "transceiver" refers to a device having at least one receiver and at least one transmitter, and use of the term "transceiver" also includes the individual terms "receiver" and/or "transmitter," unless the context clearly indicates otherwise. Also, for convenience and simplicity, the terms "connected to," "coupled with," "communicating with," "coupled to," and grammatical variations thereof (which terms also refer to direct and/or indirect relationships between the connected, coupled and/or communicating elements unless the context of the term's use unambiguously indicates otherwise) may be used interchangeably, but these terms are also generally given their art-recognized meanings.

Various embodiments and/or examples disclosed herein may be combined with other embodiments and/or examples, as long as such a combination is not explicitly disclosed herein as being unfavorable, undesirable or disadvantageous. The invention, in its various aspects, will be explained in greater detail below with regard to exemplary embodiments.

One technical principle of the present invention lies in reducing the feedback current from a monitoring photodiode in an optical transceiver module by a predetermined amount when the feedback current exceeds the adjustable and/or operating range of a corresponding laser driver and the laser driver is unable to regulate the optical output power of a laser in the corresponding TOSA, thereby keeping the feedback current in the adjustable and/or operating range of the laser driver. In that case, the laser driver determines the optical output power of the laser from the reduced feedback current. In this way, the upper limit of the adjustable and/or operating range of the laser driver can be changed while the lower limit remains unchanged. This solution extends the adjustable and/or operating range of laser drivers and enables regulation of TOSA target optical output power using a relatively high feedback current.

Embodiments of the present invention will be fully and clearly described in conjunction with the drawings in the following description.

An Exemplary Circuit

Figure 1A:
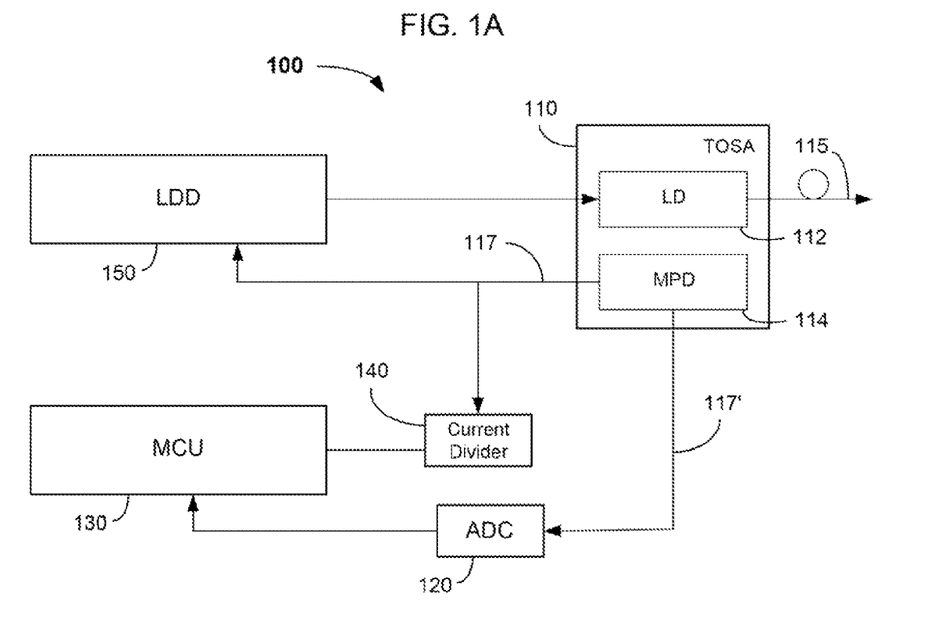
FIG. 1A is a schematic diagram showing an exemplary circuit configured to compensate, adjust or regulate a target output power in a dual-rate optical module or transceiver in accordance with embodiments of the present invention.

FIG. 1A illustrates a dual-rate power point (e.g., target power) compensating circuit 100 in accordance with one or more embodiments of the present invention. The circuit comprises a microcontroller unit (MCU) 130 and a transmitter optical subassembly (TOSA) 110. The MCU 130 may be substantially any controller or logic circuit capable of controlling the functions and/or operations described herein. The TOSA 110 comprises a laser diode (LD) 112 and a monitoring photodiode (MPD) 114, wherein the MPD 114 is connected to a laser driver (LDD) 150 which is connected to the LD 112. The MPD 114 provides a feedback current to the LDD 150 and the MCU 130 corresponding to the optical output power of the LD 112. The LDD 150 provides a driving current to the LD 112, which outputs an optical signal 115 having an output power corresponding to the value of the driving current. In one embodiment, a closed automatic power control (APC) loop for regulating the optical power of the LD 112 is formed by the LD 112, MPD 114, and LDD 150. In addition, the circuit 100 further comprises a current divider 140 between the MCU 130 and the MPD 114.

The MCU 130 may be connected to the MPD 114 via an analog-to-digital converter (ADC) circuit or module 120. Thus, the MCU 130 may receive a digital signal (e.g., a voltage) corresponding to the value of the feedback current. Furthermore, the MPD 114 provides the feedback current 117' to the ADC circuit or module 120 in real time. The feedback current 117' may be an output of a current mirror in the TOSA 110, and thus equal or substantially equal to feedback current 117 when the current divider 140 is disabled. The LDD 150 is configured to drive the LD 112 at a target optical output power based on the value of the feedback current 117.

When the LD 112 operates in high output power mode (e.g., at a first rate or frequency), the MCU 130 obtains a feedback current from the MPD 114, which is sampled and converted to a digital feedback signal by the ADC 120, and in some cases, can be as high as, e.g., 1000 µA. If the feedback current exceeds the adjustable and/or operating range of the LDD (e.g., 300~700 µA), the LDD may be unable to regulate the optical output power of the TOSA, the MCU 130 enables or activates the current divider 140 to capture or reduce the feedback current (e.g., a DC current component of the feedback current) from the MPD 114 by a predetermined amount (e.g., 300 µA, or 1000 µA-700 µA [to the peak value within the adjustable and/or operating range of the LDD 150 from, e.g., a current of 1000 µA from the MPD 114]). This brings the feedback current into the adjustable and/or operating range of the LDD 150. The LDD 150 determines or controls the optical output power of the laser 112 from the value of the reduced feedback current in this mode. As a result, the upper operating limit of the LDD 150 (and that of other laser drivers) can be effectively raised.

When the LD 112 operates in low output power mode (e.g., at a second rate or frequency different from, and in some cases, higher than the first rate or frequency), the feedback current from the MPD 114 is already within the adjustable and/or operating range of the LDD 150. The MCU 130 disables the current divider in this mode and allows the unmodified feedback current to be received directly by the LDD 150. The LDD 150 can directly determine or control the optical output power of the LD 112 from the value of the DC current in the feedback current from the MPD 114. In this case, the adjustable lower limit of the LDD 150 (and that of other laser drivers) remains unchanged.

In the present invention, TOSAs having relatively high feedback currents can be driven and regulated by LDDs having relatively narrow adjustable ranges by current division (or current reduction). If the feedback current from the MPD 114 in real time exceeds the adjustable range of LDD 150, the MCU 130 can adjust or regulate feedback current so that the LDD 150 can regulate or control the target optical output power of the LD 112 using a relatively high feedback current (e.g., outside the typical operational range of the LDD 150). As a result, the adjustable range of a laser driver can be extended to regulate a TOSA target optical output power having a relatively high feedback current.

Figure 1B:
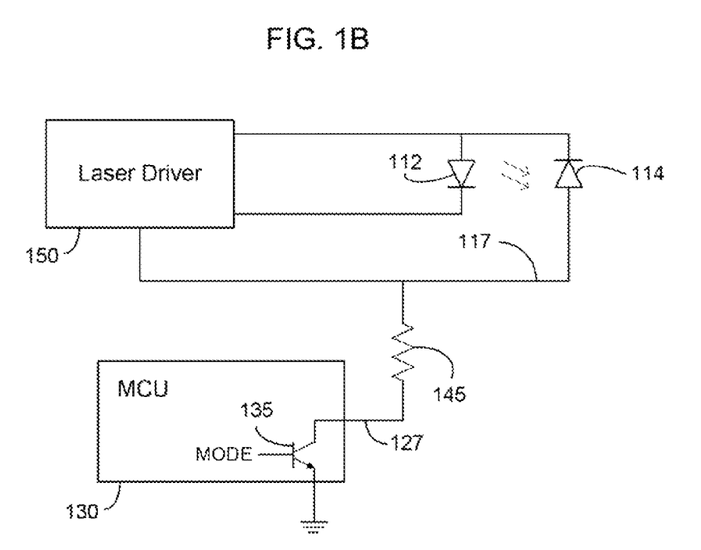
FIG. 1B is a schematic diagram showing an exemplary mode-selectable current divider in a dual-rate optical transmitter in accordance with embodiments of the present invention.

In one embodiment, as shown in FIG. 1B, the current divider comprises a bypass resistor 145 coupled between an I/O port of the microprocessor 130 and the MPD 114. More specifically, the MCU 130 and its I/O port can be set in different operating modes. Configurable I/O ports can operate as on-off circuits. When the I/O port is on (e.g., the circuit 100 is in a first mode), the bypass resistor can be configured to shunt a predetermined amount of the feedback current to the MCU 150, thereby reducing the amount of the feedback current to the LDD 150. The amount by which the adjustable range of the LDD 150 can be extended corresponds to the resistance value of the bypass resistor.

When the LD 112 operates in a high-rate (or high power) mode, the I/O pin of the MCU coupled to the bypass resistor may be set at a level activating the current divider (e.g., high electrical level). In this configuration, the I/O pin will be in an open drain mode, and a weak pull-up mode will be disabled. For example, a transistor or other switch 135 can be turned on by the MCU 130, in which case feedback current from the MPD 114 can be shunted to ground, thereby compensating for the high optical output power point or value. The transistor 135 can be on the MCU chip 130, electrically connected to a pad corresponding to the I/O pin. The transistor 135 can be an NPN bipolar junction transistor, a PNP bipolar junction transistor, an NMOS transistor, a PMOS transistor, or other transistor or switch.

When the LD 114 operates in a low-rate (or low power) mode, the transmitter output power point or value does not need current compensation, so the MCU 130 sets the I/O port to a high resistance or high impedance state (e.g., by turning off the transistor 135). The LDD 150 then regulates the optical power directly from the feedback current, without any current going through the bypass resistor 145. In the present invention, the current divider 140 can be disabled or enabled via configuration (e.g., of the MCU I/O port) to increase the upper limit of the adjustable and/or operating range of the LDD 150 and keep the lower limit unchanged.

The resistance value of the bypass resistor 145 can be determined based on the distribution and/or range of the feedback current (e.g., as determined by testing). After that, the TOSA 110 and bypass resistor 145 are set in a compensating circuit. When the compensating circuit is in operation, the MCU 130 activates and deactivates the current divider 140 to implement feedback current reduction/shunting.

The resistance value of the bypass resistor 145 may be defined by determining the overrun by which the feedback current (Im) has exceeded the adjustable and/or operating range of a LDD. This can be done by analyzing the distribution range of a batch of feedback currents. The overrun is the amount of feedback current that needs to be shunted (for example, a predetermined amount of DC current) from the feedback current 117 from the MPD 114 (e.g., to bring the feedback current into the adjustable or operating range of the LDD 150, such as to the maximum value of the adjustable or operating range of the LDD 150), and then the resistance value of the bypass resistor is calculated from the voltage on the TOSA PD pin and the overrun.

When the compensating circuit is in operation, and feedback current from the MPD 114 in real time from an optical module exceeds the adjustable and/or operating range of a laser driver 150 so that the laser driver 150 cannot regulate the optical output power of the TOSA 110 (e.g., the LD 112), a microprocessor 130 in the optical module enables a current divider 140 to capture (e.g., shunt or reduce) a predetermined amount of DC current from the feedback current 117, thereby keeping the feedback current 117 in the adjustable/operating range of the laser driver 150. The laser driver 150 determines the optical output power of the laser 112 from the value of the DC current from the MPD 114. Thus, when the feedback current 117 from the MPD 114 in real time exceeds the adjustable and/or operating range of the laser driver, the laser driver can regulate the target optical output power of the LD 112 using a relatively high feedback current 117. This solution extends the adjustable range of the laser driver 150 and enables it to regulate the target optical output power from a relatively high feedback current with a broad testing range and high accuracy.

In one example, the feedback current 117 from the monitor photodiode 114 can be set to a target value corresponding to the driving current that causes the LD 112 to output an optical signal at the target output power (e.g., using a register on the MCU 130, on the laser driver 140 [e.g., an automatic power control setting (APCSET) register], or in the TOSA 110). In such a register, the target feedback current 117 from the monitor photodiode 114 can be set to a value from 7.185 $\mu$A to 1800 $\mu$A. When the feedback current 117 to the LDD 140 has a high value, the TOSA (e.g., laser) output power will be high, so the target feedback current setting (e.g., in the APCSET register) allows the user to set a target monitor photodiode current (feedback current), and the LDD 140 adjusts the TOSA (e.g., laser) output power level in response to the feedback current, which ensures that the feedback current (and thus the TOSA/laser output power) reaches the target value. Consequently, in some embodiments, the optical transmitter/module 100 may comprise first and second target feedback current setting registers, one programmed for the first (e.g., low power or low transmission rate) mode and the other programmed for the second (e.g., high power or high transmission rate) mode.

In a high-power or high transmission rate mode, the actual feedback current 117 from the monitor photodiode 114 can be as high as 2000 $\mu$A (e.g., when a TOSA or laser output power of −2 dbm is desired). Therefore, when the target feedback current 117 is set to a high value (e.g., greater than 1800 $\mu$A), the current divider must be able to reduce the feedback current 117 (e.g., by 200-300 $\mu$A) to a value within the working range of the laser driver 150. The present mode selection and feedback current reduction technique can therefore ensure that the target TOSA or laser output power level is maintained maintain even when the actual feedback current has a value above 1800 $\mu$A (e.g., 2000 $\mu$A).

Figure 2A:
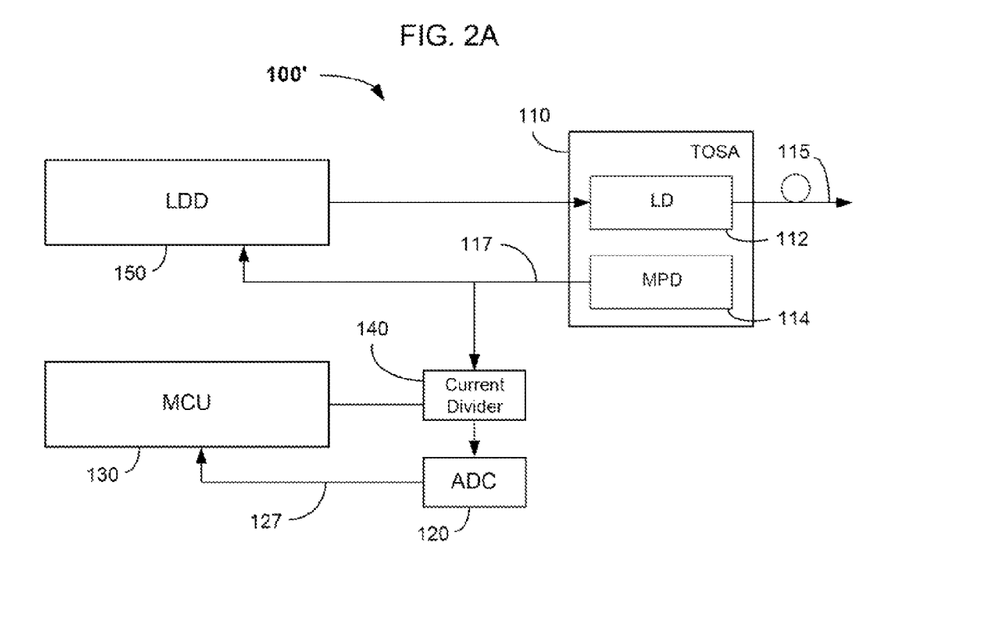
FIG. 2A is a schematic diagram showing an exemplary alternative circuit configured to compensate, adjust or regulate a target output power in a dual-rate optical module or transceiver in accordance with embodiments of the present invention.

FIG. 2A illustrates an alternative dual-rate power point (e.g., target power) compensating circuit 100' in accordance with one or more embodiments of the present invention. The circuit 100' is substantially the same as the circuit 100 in FIG. 1A, except that the analog-to-digital converter (ADC) circuit or module 120 is connected to the current divider 140 and the MCU 130, but is not connected directly to the MPD 114 or the transmitter optical subassembly (TOSA) 110. In this design, the MPD 114 provides a feedback current 117 to the LDD 150 corresponding to the optical output power of the LD 112, and a reduced feedback current 127 is provided to the MCU 130 via the ADC circuit or module 120. Such an arrangement enables the bypass current to be more controllable and/or flexible, and can be used to control the weight or amount of the bypass current passing through the current divider 140.

Figure 2B:
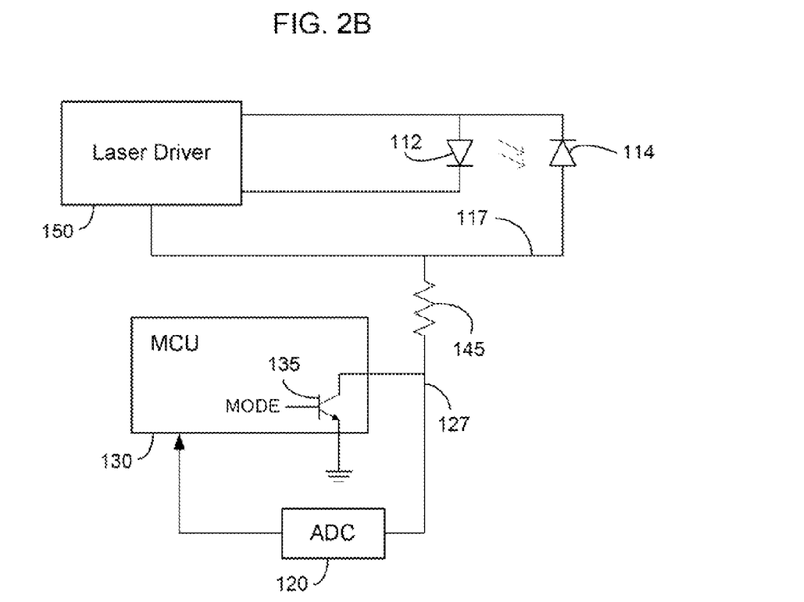
FIG. 2B is a schematic diagram showing an exemplary alternative mode-selectable current divider in a dual-rate optical transmitter in accordance with embodiments of the present invention.

As shown in FIG. 2B, the MCU 130 selects the mode by applying a bias signal MODE to the transistor 135. When the transistor 135 is an NPN or NMOS transistor, and the signal MODE has a relatively high value (but less than the full rail power supply, such as VCC or VDD), the transistor 135 is on, but has a small resistance or impedance. In such a case, the current divider (e.g., resistor 145) is activated, and the ADC circuit or module 120 receives a first reduced current input corresponding to the high power mode. On the other hand, when the signal MODE has a relatively low value (but greater than a ground potential), the transistor 135 is partially on, but has a relatively high resistance or impedance. In such a case, the MCU 130 deactivates the current divider to select a second, low power mode, and the transistor 135 sinks less current than when the MCU 130 selects the high power mode. In such a case, the ADC circuit or module 120 receives a reduced feedback current at 127 that is higher than the first reduced current. Thus, in either case (i.e., the transistor 135 receives a high bias or a low bias), the resistor 145 and the transistor 135 can be configured by the MCU 130, and the split feedback current ratio (and thus the mode) is controlled by the MCU 130 by configuring the I/O port in either of two ways. In this embodiment, the ADC 120 can be used to set the range and/or level of the split feedback currents 117 and 127 (e.g., by setting the bias applied by the control signal MODE). Thus, although the LDD 150 and the MCU 130 both receive a feedback current, the amount or proportion of feedback current received by each of the LDD 150 and the MCU 130 is different, in both the first (e.g., high power or high transmission rate) mode and the second (e.g., low power or low transmission rate) mode.

Figure 3A:
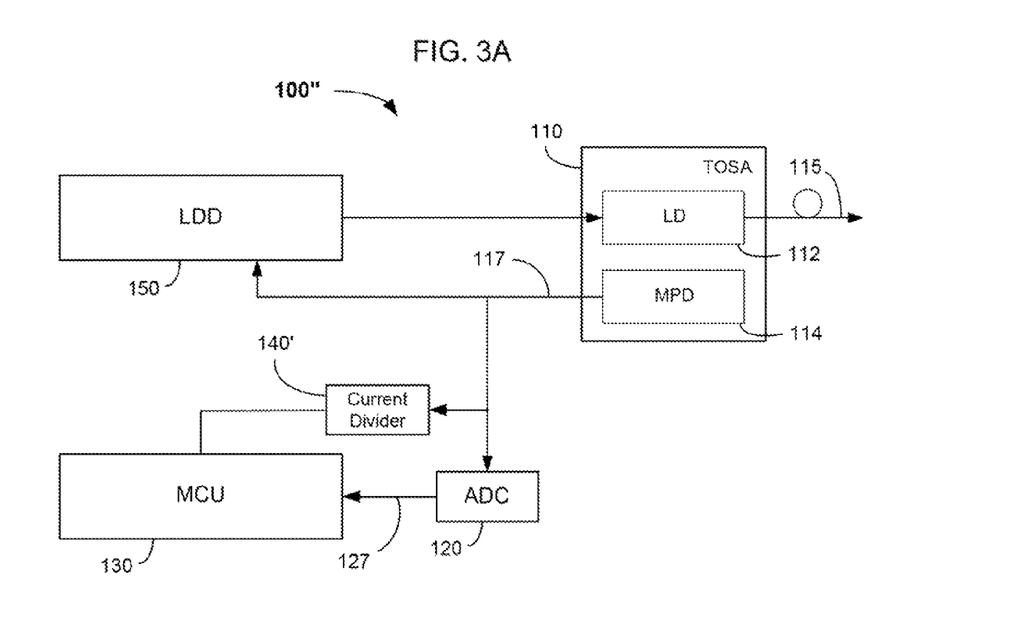
FIG. 3A is a schematic diagram showing a further exemplary alternative circuit configured to compensate, adjust or regulate a target output power in a dual-rate optical module or transceiver in accordance with embodiments of the present invention.

FIG. 3A illustrates a further alternative dual-rate power point (e.g., target power) compensating circuit 100" in accordance with one or more embodiments of the present invention. The circuit 100" is substantially the same as the circuits 100 and 100' in FIGS. 1A and 2A, except that the analog-to-digital converter (ADC) circuit or module 120 is connected in parallel with the current divider 140 between the MCU 130 and the MPD 114 or TOSA 110. In this design, the MPD 114 provides a feedback current 117 to both the LDD 150 and the MCU 130 (via the ADC circuit or module 120). Such an arrangement enables the LDD 150 and the MCU 130 to receive substantially the same bypass current.

Figure 3B:
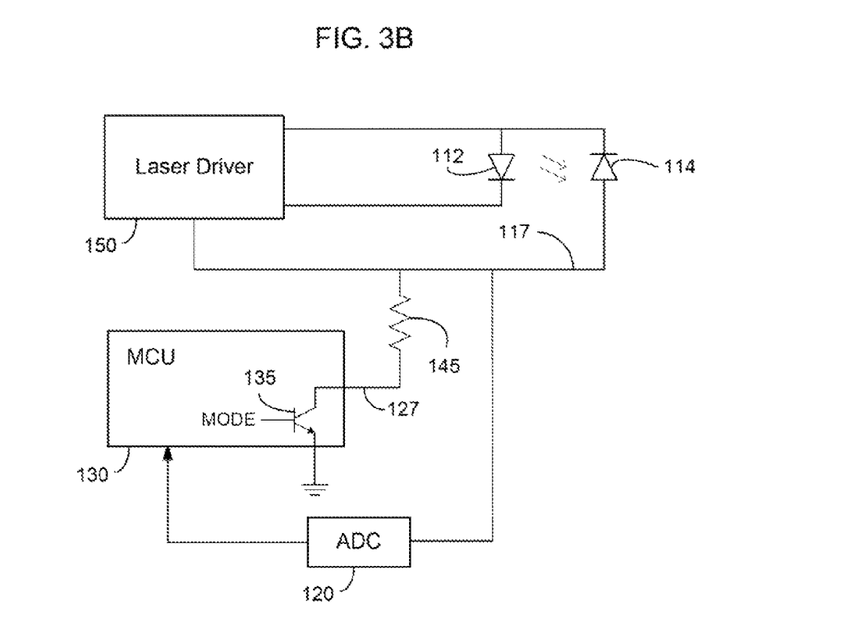
FIG. 3B is a schematic diagram showing a further exemplary alternative mode-selectable current divider in a dual-rate optical transmitter in accordance with embodiments of the present invention.

FIG. 3B shows an example of an implementation of the compensating circuit 100" of FIG. 3A. The MCU 130 selects the mode by applying a control signal MODE to the transistor 135. When the transistor 135 is an NPN or NMOS transistor, and the signal MODE corresponds to a high digital logic state (e.g., at or near the full rail power supply, such as VCC or VDD), the transistor 135 is on, and a relatively large bypass current is sunk by the transistor 135 from the output node 117 of the MPD 114. On the other hand, when the signal MODE corresponds to a low digital logic state (e.g., at or near a ground potential), substantially no bypass current is sunk by the transistor 135 from the output node 117 of the MPD 114.

However, in the embodiment(s) of FIG. 3A-B, the MCU 130 receives a digital equivalent 127 of the feedback current 117 received by the LDD 150, regardless of the mode selected by the MCU 130. This arrangement may make the creation of a lookup table (which may be stored in memory on the MCU 130) relatively easy.

The present compensating circuit pertains to all optical modules employing closed-loop regulation of the optical output power. As long as feedback currents exceed the adjustable/operating range of the laser driver, this circuit and/or method may be an option.

Exemplary Method(s) of Using the Exemplary Circuit(s)

A method of compensating or adjusting the power point (or target output power) of a dual-rate optical transmitter in accordance with embodiments of the present invention pertains to optical modules employing a closed-loop regulation mode (e.g., using an automatic power control loop to regulate the driving current from a laser driver circuit). As discussed above, FIG. 1A shows an optical module (e.g., optical transmitter) 100 having a compensating circuit in accordance with one or more embodiments of the present invention, which comprises an MCU 130 and a TOSA 110. The TOSA 110 comprises a LD 112 and an MPD 114, where the MPD 114 is connected to and feeds back LD optical output power information to a laser driver (LDD) 150, which drives the LD 112. Thus, in one embodiment, the MPD 114, LDD 150, and LD 112 form a closed loop automatic power control (APC) regulating loop for maintaining a target optical output power from the LD 112. In addition, the circuit 100 further comprises a current divider 140 between the MCU 130 and the MPD 114. The MCU 130 is also connected to the MPD 114 via an ADC circuit or module 120.

Figure 4:
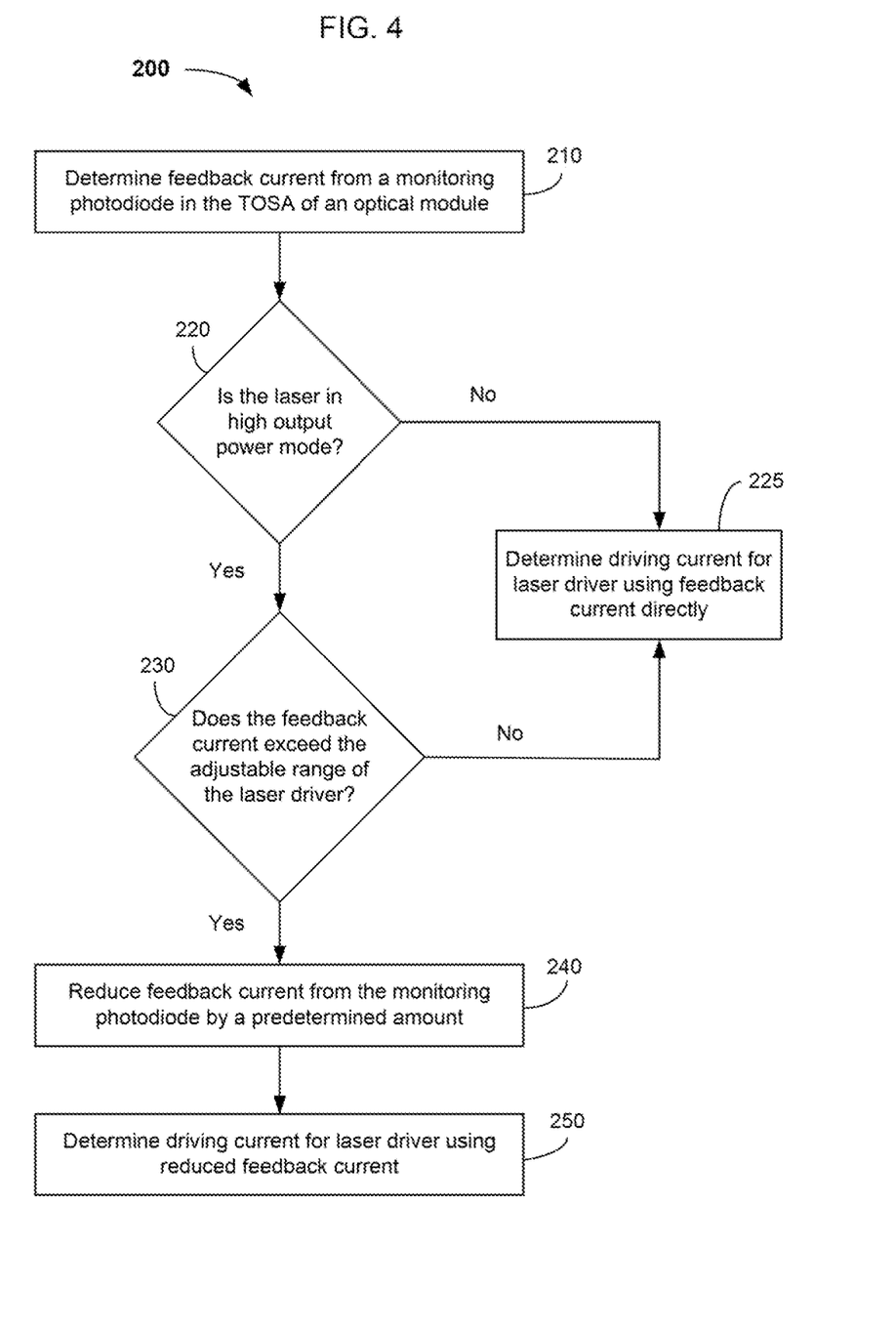
FIG. 4 is a flow diagram showing an exemplary method of compensating, adjusting or regulating a target output power in a dual-rate optical module or transceiver in accordance with embodiments of the present invention.

FIG. 4 shows a flow chart 200 for an exemplary method of regulating or adjusting the power point (or target output power) of a dual-rate optical transmitter in accordance with embodiments of the present invention. At 210, the feedback current from the optical module is determined (e.g., by a monitoring photodiode in the optical module, which may be mounted on a back facet of the TOSA and configured to receive light from a laser diode in the optical module). In a more specific embodiment, the MCU obtains the feedback current from the MPD by sampling the feedback current using an ADC module and converting the analog feedback current signal to a digital signal (e.g., a voltage having a value corresponding to the value of the feedback current).

At 220, the MCU determines whether the laser is operating in high output power mode (which may correspond to a first, relatively high data rate). For example, the MCU may compare the digital signal corresponding to the feedback current value to a reference value or threshold voltage, and when the digital signal exceeds the reference value or threshold voltage, the laser is determined to be operating in the high output power mode. However, when the digital signal does not exceed the reference value or threshold voltage, the LD is considered to be operating in a low output power mode (which may correspond to a second, relatively low data rate), and the feedback current from the MPD is generally within the adjustable and/or operating range of the LDD. Therefore, at 225, the method determines directly from the actual value of the feedback current the driving current from the LDD that provides the target optical output power from the LD, similar or consistent with the description above.

In the high output power mode, the feedback current from the MPD may exceed the adjustable and/or operating range of the laser driver, and the laser driver may not be able to regulate the optical output power of the laser in the TOSA. Thus, in one embodiment, the method may at 230 determine whether the feedback current exceeds the adjustable and/or operating range of the laser driver, as the feedback current may, in some cases, still be within the adjustable and/or operating range of the laser driver even when the loser (or the optical transmitter as a whole) is in high power mode. In such a case, the reference value or threshold voltage corresponding to the uppermost value of the adjustable and/or operating range of the laser driver may differ from (and be lower than) the reference value or threshold voltage for determining whether the laser is in the high output power mode. When the feedback current from the MPD does not exceed the adjustable and/or operating range of the laser driver, the method determines the driving current of the LDD directly from the actual value of the feedback current at 225. However, the determination step 230 is optional, and is generally not performed when the reference value or threshold voltage for determining whether the laser is in the high output power mode also determines whether the feedback current exceeds the adjustable and/or operating range of the laser driver.

When the MCU determines whether the laser is operating in high output power mode and, optionally, the feedback current from the MPD exceeds the adjustable and/or operating range of the laser driver, the MCU reduces the feedback current from the MPD by a predetermined amount at 240 to keep the feedback current in the adjustable and/or operating range of the laser driver. In one embodiment, the feedback current is a DC current, and the MCU turns on or enables the current divider to take or shunt the predetermined amount of the DC current from the feedback signal (e.g., 117 in FIGS. 1A-B) to the laser driver.

In a more specific embodiment, the current divider comprises a bypass resistor (not shown in the Figures) coupled between an I/O port of the microprocessor and the MPD. The MCU and its I/O port can be set in different operating modes (e.g., high rate vs. low rate modes, or high output power vs. low output power modes). A configurable I/O port can operate as an on-off circuit, and the MCU can turn the I/O port on and off in response to the determination(s) that the laser is operating in high output power mode and, optionally, that the feedback current from the MPD exceeds the adjustable and/or operating range of the laser driver. The bypass resistor is configured to shunt the predetermined amount of the feedback current (e.g., to a ground potential or other current dissipating node or circuit). The resistance value of the bypass resistor determines the extension of the adjustable and/or operating range of the LDD. When the LD operates in the high-rate (or high power) mode, the I/O pin of the MCU coupled to the bypass resistor can be set in an open drain mode or configuration (e.g., by setting the I/O pin at a low electrical level), and a weak pull-up mode of the I/O pin can be disabled, as described herein. The feedback current shunted through the current divider is then grounded, thereby compensating or adjusting for the high power point (or target output power of the LD). When the LD operates in the low-rate (or low power) mode, the transmitter power point can be regulated or adjusted using the feedback current directly, and the current divider is not needed to shunt current or implement compensation. In the low-rate (or low power) mode, the MCU sets its I/O port in a high resistance or high impedance state, and the LDD regulates or controls the optical power directly from the actual feedback current, instead of some of the current going through the bypass resistor. Thus, the current divider can be disabled or enabled via configuration of the MCU I/O port to increase the upper limit of the adjustable control range of the LDD, while the lower limit remains unchanged.

As described earlier, the resistance value of the bypass resistor can be determined based on the distribution and/or range of the feedback current (which can be determined by testing). After that, the TOSA and bypass resistor are set in a compensating circuit. When the compensating circuit is in operation, the MCU activates and deactivates the current divider to implement feedback current reduction/shunting. Furthermore, the resistance value of the bypass resistor may be determined by determining the overrun by which the feedback current has exceeded the adjustable and/or operating range of a LDD. As described earlier, this can be done by analyzing the distribution range of a batch of feedback currents. The overrun is the amount of feedback current to be shunted (for example, a predetermined amount of DC current) from the feedback current to bring the feedback current into the adjustable or operating range of the LDD. For example, the amount of shunted feedback current may bring reduced feedback current within the adjustable or operating range of the LDD. The resistance value of the bypass resistor is than calculated from the voltage on the TOSA PD pin and the overrun. At 250, the LDD determines the optical output power of the laser from the reduced feedback current.

In the present invention, TOSAs having LDs and monitoring photodiodes that provide relatively high feedback currents can be driven and regulated by LDDs having relatively narrow adjustable ranges by reducing the feedback current (e.g., by current division) in an operational mode that results in such high feedback currents. If the feedback current from the MPD in real time exceeds the adjustable range of the LDD, the LDD can regulate the target optical output power of the LD, even though the MPD has a relatively high feedback current. As a result, the adjustable range of the laser driver can be utilized to regulate the target optical output power with a relatively high feedback current. The present method extends the adjustable and/or operating range of the laser driver and enables it to regulate the target optical output power of the LD using a relatively high feedback current. In this way, the upper limit of the adjustable and/or operating range of the laser driver can be extended, while the lower limit remains unchanged. Also, the present method may pertain to similar compensations to other parameters of optical modules, such as low transmitter power calibration accuracy, etc.

Exemplary Optical Modules

Figure 5A:
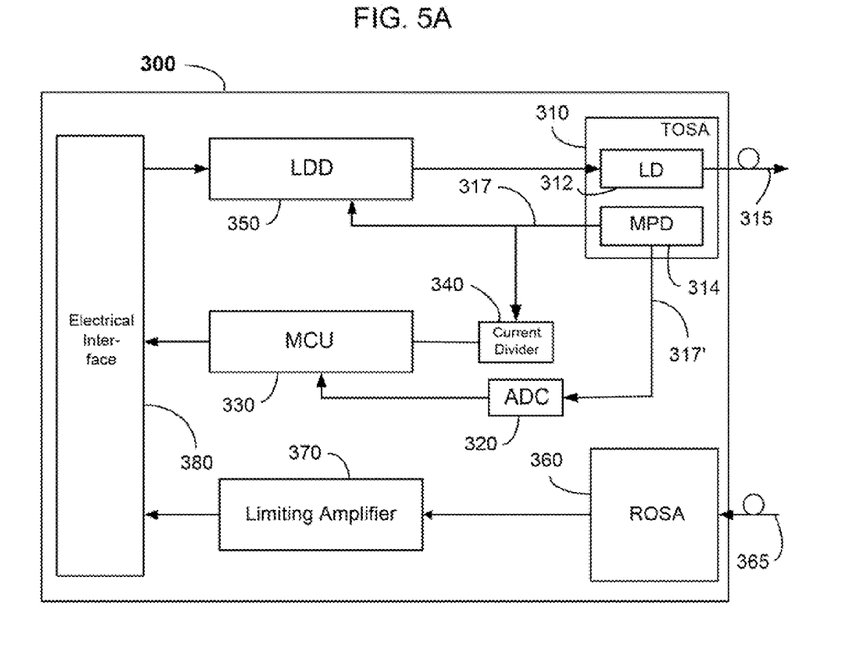
FIG. 5A is a schematic diagram showing an exemplary optical module in accordance with embodiments of the present invention.

Referring to FIG. 5A, an exemplary optical module (e.g., including an optical transceiver) 300 in accordance with embodiments of the present invention comprises a receiver optical subassembly (ROSA) 360 and a limiting amplifier 370 coupled in sequence, and an MCU 330 and a TOSA 310, the TOSA 310 comprising an LD 312 and an MPD 314. The ROSA 360 generally includes one or more photodiodes configured to receive optical signals from a network (e.g., sent over an optical fiber) and convert the optical signals to electrical signals, and optionally, one or more transimpedance amplifiers configured to amplify the electrical signals. The limiting amplifier 370 is configured to amplify the signals received from the ROSA 360. In the exemplary optical module 300, the receiving photodiode(s) in the ROSA 360 may be connected to a send current divider (which may be controlled by the MCU 330) to reduce the current to the limiting amplifier 370 when the current output by the receiving photodiode(s) exceeds the operating range of the limiting amplifier 370 for amplifying input currents.

The MPD 314 is connected to and provides a feedback current to a laser driver (LDD) 350, which is connected to and provides a driving current to the LD 312. The MPD 314, LDD 350, and LD 312 form a closed loop automatic power control (APC) regulating loop for maintaining a target optical output power from the LD 112. The optical module 300 further comprises a current divider 340 between the MCU 330 and the MPD 314. The MPD 314 may be connected to the MCU 330 via an analog-to-digital converter (ADC) circuit or module 320 and a current mirror in the TOSA 310, at or near an output of the MPD 314. Thus, the MCU 330 may receive a digital signal (e.g., a voltage) corresponding to the value of the feedback current 317', which may be useful for comparing to one or more thresholds or voltages representative of the maximum value of the adjustable and/or operating range of the LDD 350. The MCU 330, the LDD 350 and the limiting amplifier 370 are respectively connected to an electrical interface 380 (which may, for example, comprise golden finger connectors) to achieve electrical signal input and output with, e.g., a host device (which may have a slot or opening configured to receive the optical module 300). Furthermore, the MPD 314 provides the feedback current 317 in real time. The LDD 350 is configured to drive the LD 312 at a target optical output power based on the value of the feedback current 317.

When the LD 312 operates in a first (e.g., high output power) mode, the MCU 330 obtains the feedback current 317 from the MPD 314 via the ADC 320 (e.g., by sampling). In one example, the feedback current 317 in the high output power mode may be 1000 µA or about 1000 µA. If the feedback current 317 exceeds the adjustable and/or operating range of the LDD (e.g., 300~700 µA), and the LDD 350 is unable to regulate the optical output power of the LD 312 in the TOSA 310, the MCU 330 enables the current divider 340 to reduce or capture a predetermined amount of the feedback current from the MPD 314. If the feedback current exceeds the adjustable and/or operating range of the LDD (e.g., 300~700 µA), the MCU 330 enables or activates the current divider 340 to capture or reduce the feedback current (e.g., a DC current component of the feedback current) from the MPD 314 by a predetermined amount (e.g., 300 µA, or 1000 µA-700 µA), for example to the peak value within the adjustable and/or operating range of the LDD 350 (from, e.g., a current of 1000 µA from the MPD 314). This brings the feedback current into the adjustable and/or operating range of the LDD 350. The LDD 350 determines or controls the optical output power of the laser 312 from the value of the reduced feedback current in this mode. As a result, the upper operating limit of the LDD 350 (and that of other laser drivers) can be effectively raised.

When the LD 312 operates in a second (e.g., low output power) mode, the feedback current from the MPD 314 is generally within the adjustable and/or operating range of the LDD 350. The MCU 330 disables the current divider 340 in the second operational mode, and the LDD 350 determines the optical output power of the LD 312 directly from the value of the feedback current (e.g., a DC current or DC current component of the feedback current) from the MPD 314. As a result, the adjustable lower limit of the LDD 350 remains unchanged.

In the present invention, TOSAs having relatively high feedback currents can be driven and regulated by LDDs having relatively narrow adjustable and/or operating ranges by current division or current reduction. If the feedback current from the MPD 314 in real time exceeds the adjustable and/or operating range of the LDD 350, the MCU 330 can adjust or regulate feedback current so that the LDD 350 can regulate or control the target optical output power of the LD 312 using a relatively high feedback current (e.g., outside the typical operational range of the LDD 350). As a result, the adjustable and/or operating range of a laser driver can be extended to regulate a TOSA target optical output power having a relatively high feedback current.

In one embodiment, the current divider 340 comprises a bypass resistor (not shown in FIGS. 5A-C) coupled between an I/O port of the microprocessor 330 and the MPD 314. More specifically, the MCU 330 and its I/O port can be set in different operating modes. Configurable I/O ports can operate as on-off circuits. The bypass resistor can be configured to shunt a predetermined amount of the feedback current to the MCU 350, thereby reducing the amount of the feedback current to the LDD 350. The amount by which the adjustable range of the LDD 350 can be extended corresponds to the resistance value of the bypass resistor.

When an LD 312 operates in a high-rate (or high power) mode, the I/O pin of the MCU coupled to the bypass resistor can be set at a high electrical level. In this configuration, the I/O pin will be in an open drain mode, and a weak pull-up mode will be disabled, in which case feedback current from the MPD 314 can be shunted to ground, thereby compensating for the high optical output power point or value. When a LD 314 operates in a low-rate (or low power) mode, the transmitter output power point or value does not need current compensation, so the MCU 330 sets the I/O port to a high resistance or high impedance state (e.g., by turning the transistor 135 in FIGS. 1B, 2B and 3B off). The LDD 350 then regulates the optical power directly from the feedback current, without any current going through the bypass resistor. In the present invention, the current divider 340 can be disabled or enabled via configuration (e.g., of the MCU I/O port) to increase the upper limit of the adjustable and/or operating range of the LDD 350 and keep the lower limit unchanged.

The resistance value of the bypass resistor can be determined based on the distribution and/or range of the feedback current (e.g., as determined by testing). After that, the TOSA 310 and bypass resistor are set in a compensating circuit. When the compensating circuit is in operation, the MCU 330 activates and deactivates the current divider 340 to implement feedback current reduction/shunting.

The resistance value of the bypass resistor may be defined by determining the overrun by which the feedback current has exceeded the adjustable and/or operating range of a LDD. This can be done by analyzing the distribution range of a batch of feedback currents. The overrun is the amount of feedback current that needs to be shunted (for example, a predetermined amount of DC current) from the feedback current from the MPD 314 (e.g., to bring the feedback current into the adjustable or operating range of the LDD 350, such as to the maximum value of the adjustable or operating range of the LDD 350), and then the resistance value of the bypass resistor is calculated from the voltage on the TOSA PD pin and the overrun.

When the compensating circuit is in operation, and feedback current from the MPD 314 in real time from an optical module exceeds the adjustable and/or operating range of a laser driver 350 so that the laser driver 350 cannot regulate the optical output power of the TOSA 310 (e.g., the LD 312), a microprocessor 330 in the optical module enables a current divider 340 to capture (e.g., shunt or reduce) a predetermined amount of DC current from the feedback current 317, thereby keeping the feedback current 317 in the adjustable/ operating range of the laser driver 350. The laser driver 350 determines the optical output power of the laser 312 from the value of the DC current from the MPD 314. Thus, when the feedback current 317 from the MPD 314 in real time exceeds the adjustable and/or operating range of the laser driver, the laser driver can regulate the target optical output power of the LD 312 using a relatively high feedback current 317. This solution extends the adjustable range of the laser driver 350 and enables it to regulate the target optical output power from a relatively high feedback current with a broad testing range and high accuracy.

Figure 5B:
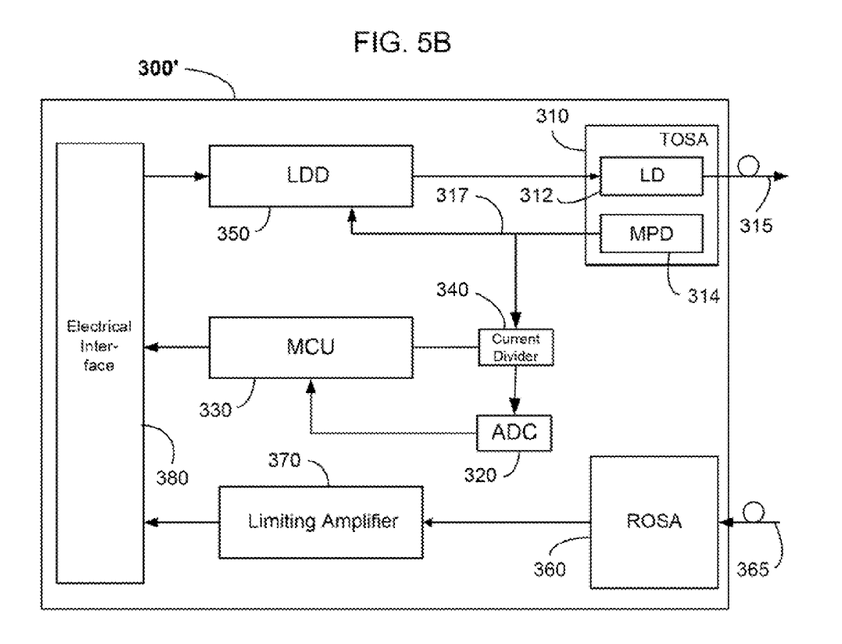
FIG. 5B is a schematic diagram showing an exemplary alternative optical module in accordance with embodiments of the present invention.

FIG. 5B shows an exemplary alternative optical module or transceiver 300' in accordance with embodiments of the present invention. The optical module or transceiver 300' is substantially the same as the optical module or transceiver 300 in FIG. 5A, except that the ADC 320 is in series with the current divider 340. The operation of the ADC 320, the current divider 340, and the MCU 330 in the optical module or transceiver 300' is as described for the exemplary circuitry in FIGS. 2A-B.

Figure 5C:
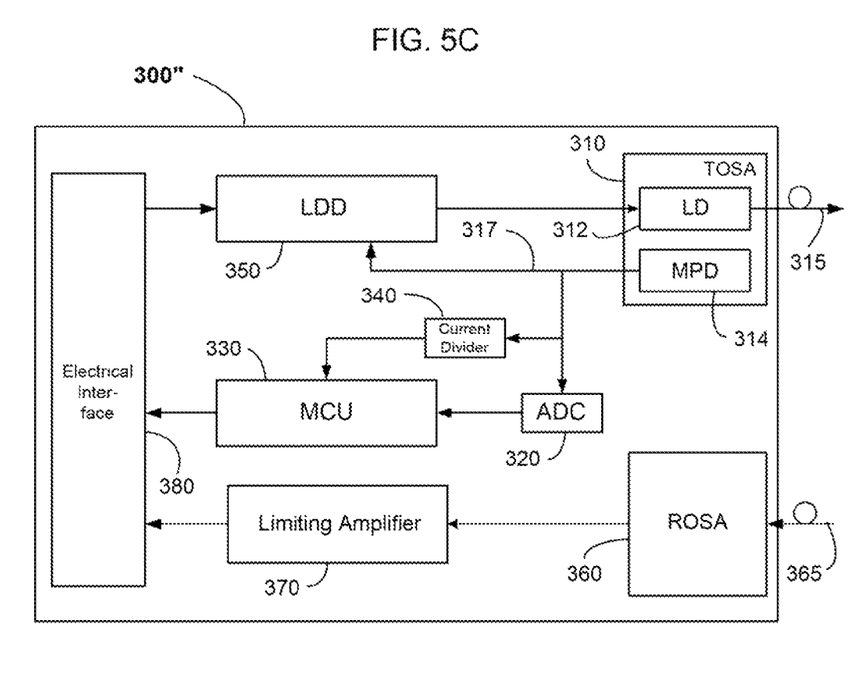
FIG. 5C is a schematic diagram showing a further exemplary alternative optical module in accordance with embodiments of the present invention.

FIG. 5C shows another exemplary optical module or transceiver 300" in accordance with embodiments of the present invention. The optical module or transceiver 300" is substantially the same as the optical modules or transceivers 300 and 300' in FIGS. 5A-B, except that the ADC 320 and the current divider 340 are in parallel between the feedback current node 317 from the MPD 314 and the MCU 330. The operation of the ADC 320, the current divider 340, and the MCU 330 in the optical module or transceiver 300" is as described for the exemplary circuitry in FIGS. 3A-B.

The present compensating circuit pertains to all optical modules employing closed-loop regulation of the optical output power. As long as feedback currents exceed the adjustable/operating range of the laser driver, this circuit and/or method may be an option.

An Exemplary Optical Communication System

Figure 6:
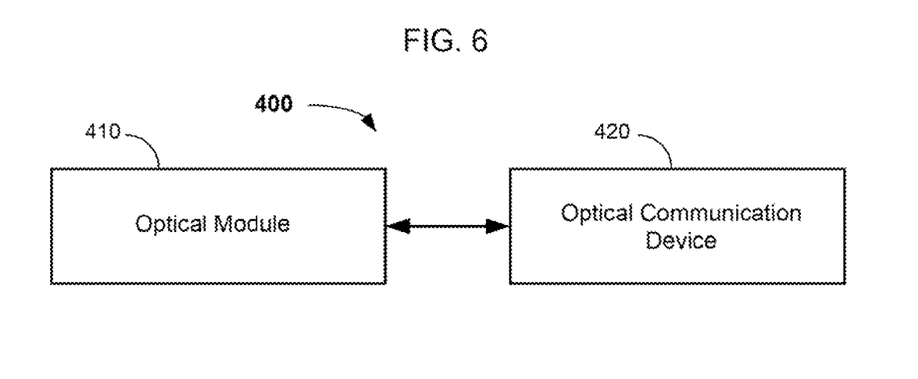
FIG. 6 is a schematic diagram showing an exemplary optical communication system in accordance with embodiments of the present invention.

FIG. 6 shows an exemplary optical communication system 400, comprising one or more optical communication devices 420 and at least one optical module 410. For simplicity, only one optical module 410 and one optical communication device 420 are shown in FIG. 6. Each optical module 410 is connected to at least one of the optical communication devices 420. The optical module 410 and optical communication device 420 may be linked via a bus driver communication system or another communication system (e.g., using optical fibers and optical repeaters and/or optical switches). An example of the optical module 410 is described above with regard to FIGS. 5A-5C.

The optical communication devices 420 may be fiber switches, optical network units (ONUs), data communication (datacom) devices, telecommunication (telecom) devices, optical line terminations (OLTs) or passive optical networks (PONs), or other optical communication devices. The present invention is not intended to limit the optical communication devices 420 to a certain type.

CONCLUSION/SUMMARY

Embodiments of the present invention advantageously provide circuits and methods for compensating, controlling or adjusting a power point or target output power of a dual-rate optical transmitter. When a monitoring photodiode in the transmitter provides a feedback current that exceeds the adjustable and/or operating range of a laser driver the drives the laser in the transmitter (e.g., when the transmitter operates in a high-speed or high-power mode), the feedback current can be reduced (e.g., by a current divider connected between the monitoring photodiode and a microcontroller that controls the current divider). When the transmitter is in a low-speed or low-power mode, the laser driver can control or adjust the power point or target output power of the laser directly from the actual feedback current. Thus, the present invention effectively extends the adjustable and/or operating range of a laser driver in an optical transmitter.

The foregoing descriptions of specific embodiments of the present invention have been presented for purposes of illustration and description. They are not intended to be exhaustive or to limit the invention to the precise forms disclosed, and obviously many modifications and variations are possible in light of the above teachings. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. An optical transmitter, comprising:
   a laser driver;
   a transmitter optical subassembly (TOSA), comprising a laser connected to the laser driver, and a monitoring photodiode (MPD) receiving light from said laser and providing a feedback current to said laser driver, wherein said laser driver and said laser operate in a first mode and a second mode;
   a current divider comprising a resistor connected to said MPD and a switch between the resistor and ground, wherein the current divider is configured to reduce said feedback current from said MPD when said laser operates in said first mode;
   an analog-to-digital converter (ADC) configured to convert the feedback current, a mirrored feedback current, or a reduced feedback current to a digital signal, wherein the mirrored feedback current and the reduced feedback current are produced or generated from the feedback current;
   a microprocessor configured to receive the digital signal, turn on said switch in the first mode and turn off said switch in the second mode;
   wherein said laser driver is configured to determine the output power of said laser from said feedback current reduced by said current divider in the first mode, and directly from said feedback current in the second mode.

2. The optical transmitter of claim 1, wherein said first mode is a high output power mode or a high transmission rate mode, and said second mode is a low output power mode or a low transmission rate mode.

3. The optical transmitter of claim 1, wherein said laser driver has an adjustable and/or operating range for said feedback current, and said current divider reduces a predetermined amount of DC current from said feedback current to keep said feedback current in the adjustable and/or operating range of said laser driver.

4. The optical transmitter of claim 3, wherein said feedback current exceeds the adjustable and/or operating range of said laser driver in said first mode, and said laser driver is unable to regulate an optical output power of said laser.

5. The optical transmitter of claim 3, wherein said feedback current from said MPD is in the adjustable and/or operating range of said laser driver in the low output power or low transmission rate mode.

6. The optical transmitter of claim 1, wherein said resistor comprises a bypass resistor coupled to an I/O port of said microprocessor.

7. The optical transmitter of claim 5, wherein said resistor comprises a bypass resistor coupled to an I/O port of said microprocessor.

8. The optical transmitter of claim 1, wherein said laser driver is a driver chip.

9. The optical transmitter of claim 7, wherein said laser driver is a driver chip.

10. An optical transceiver, comprising said optical transmitter of claim 1, and an optical receiver comprising (i) a receiver optical subassembly (ROSA) having a receiving photodiode therein configured to generate a current from an optical signal received by the receiving photodiode, and (ii) a limiting amplifier receiving the current from the receiving photodiode.

11. An optical module, comprising said optical transmitter of claim 5, and an optical receiver comprising (i) a receiver optical subassembly (ROSA) having a receiving photodiode therein configured to generate a current from an optical signal received by the receiving photodiode, and (ii) a limiting amplifier receiving the current from the receiving photodiode.

12. An optical communication system containing at least one optical transceiver of claim 10, connected to at least one optical communication device.

13. An optical communication system containing at least one optical module of claim 11, connected to at least one optical communication device.

14. The optical communication system of claim 12, wherein said at least one optical communication device is a fiber switch, an optical network unit, a data terminal, an optical line terminal, or a passive optical network.

15. The optical transmitter of claim 1, wherein the microprocessor turns on the switch when the feedback current exceeds the adjustable and/or operating range of the laser driver, and the current divider reduces the feedback current by a predetermined amount.

16. A method of controlling an output power of a dual-mode optical transmitter, comprising:

generating feedback current from a monitoring photodiode (MPD) detecting light from a laser in a transmitter optical subassembly (TOSA) of the optical transmitter;

when said laser operates in a high output power mode or a high transmission rate mode, (i) reducing said feedback current from said MPD using a current divider comprising a resistor coupled to said MPD and a switch between the resistor and ground by turning on the switch, wherein the current divider keeps the reduced feedback current in an adjustable and/or operating range of a laser driver that determines an optical output power of said laser from the reduced feedback current when the switch is on, and (ii) determining said optical output power of said laser from the reduced feedback current; and when said laser operates in a low output power mode or a low transmission rate mode, (iii) disabling said current divider by turning off the switch and (iv) determining said optical output power of said laser directly from the feedback current.

17. The method of claim 16, further comprising providing a driving current from said laser driver to said laser.

18. The method of claim 16, wherein the feedback current from said MPD exceeds the adjustable and/or operating range of the laser driver when said laser operates in the high output power mode or the high transmission rate mode.

19. The method of claim 18, wherein said laser driver is unable to regulate the optical output power of said laser in the high output power mode or the high transmission rate mode, and the feedback current from said MPD is reduced to a value in the adjustable and/or operating range of said laser driver.

20. The method of claim 16, wherein said switch is turned on using a microprocessor connected to said current divider, and a predetermined amount of DC current is reduced from said feedback current.

\* \* \* \* \*